United States Patent [19]

Neumann et al.

[11] 4,419,675

[45] Dec. 6, 1983

[54] IMAGING SYSTEM AND METHOD FOR PRINTED CIRCUIT ARTWORK AND THE LIKE

[75] Inventors: Don B. Neumann, Laguna Beach; Lyle K. Norton, Santa Ana; Eric V. Olson, Long Beach, all of Calif.

[73] Assignee: American Hoechst Corporation, Somerville, N.J.

[21] Appl. No.: 42,133

[22] Filed: May 24, 1979

[51] Int. Cl.³ .................. G01D 9/42; H04N 1/22; G03B 41/00

[52] U.S. Cl. .................... 346/108; 354/4; 358/296

[58] Field of Search .......... 358/293, 286, 296-300, 358/302; 346/108, 76 L; 354/3-5; 355/67-69; 428/901; 219/121 L, 121 LM, 121 LH, 121 LY

[56] References Cited

U.S. PATENT DOCUMENTS

| | | | |
|---|---|---|---|
| 3,389,403 | 6/1968 | Cottingham | 358/302 |
| 3,720,785 | 3/1973 | Van Auken | 358/297 |
| 3,800,084 | 3/1974 | Vrenko | 358/293 |
| 3,898,627 | 8/1975 | Hooker et al. | |
| 3,999,010 | 12/1976 | Dosaka et al. | 358/302 |
| 4,002,829 | 1/1977 | Hutchison | 358/302 |
| 4,046,471 | 9/1977 | Branham et al. | |

OTHER PUBLICATIONS

Dowd et al., The Bell System Technical Journal, 11/70, pp. 2061-2067, 2069-2075, 2043-2059, 2033-2041.

Primary Examiner—Raymond F. Cardillo, Jr.
Attorney, Agent, or Firm—Flehr, Hohbach, Test, Albritton & Herbert

[57] ABSTRACT

Imaging system and method suitable for producing artwork masters for use in the manufacture of printed circuit boards. A beam of coherent radiation is modulated in accordance with data from a source defining the image to be produced, and the modulated beam is scanned across an output medium to form the desired image. A reference signal is generated in accordance with the position of the beam on the output medium, and this signal is shifted forward in phase to compensate for any delay between the generation of the reference signal and the arrival of the modulated beam at the output medium.

4 Claims, 14 Drawing Figures

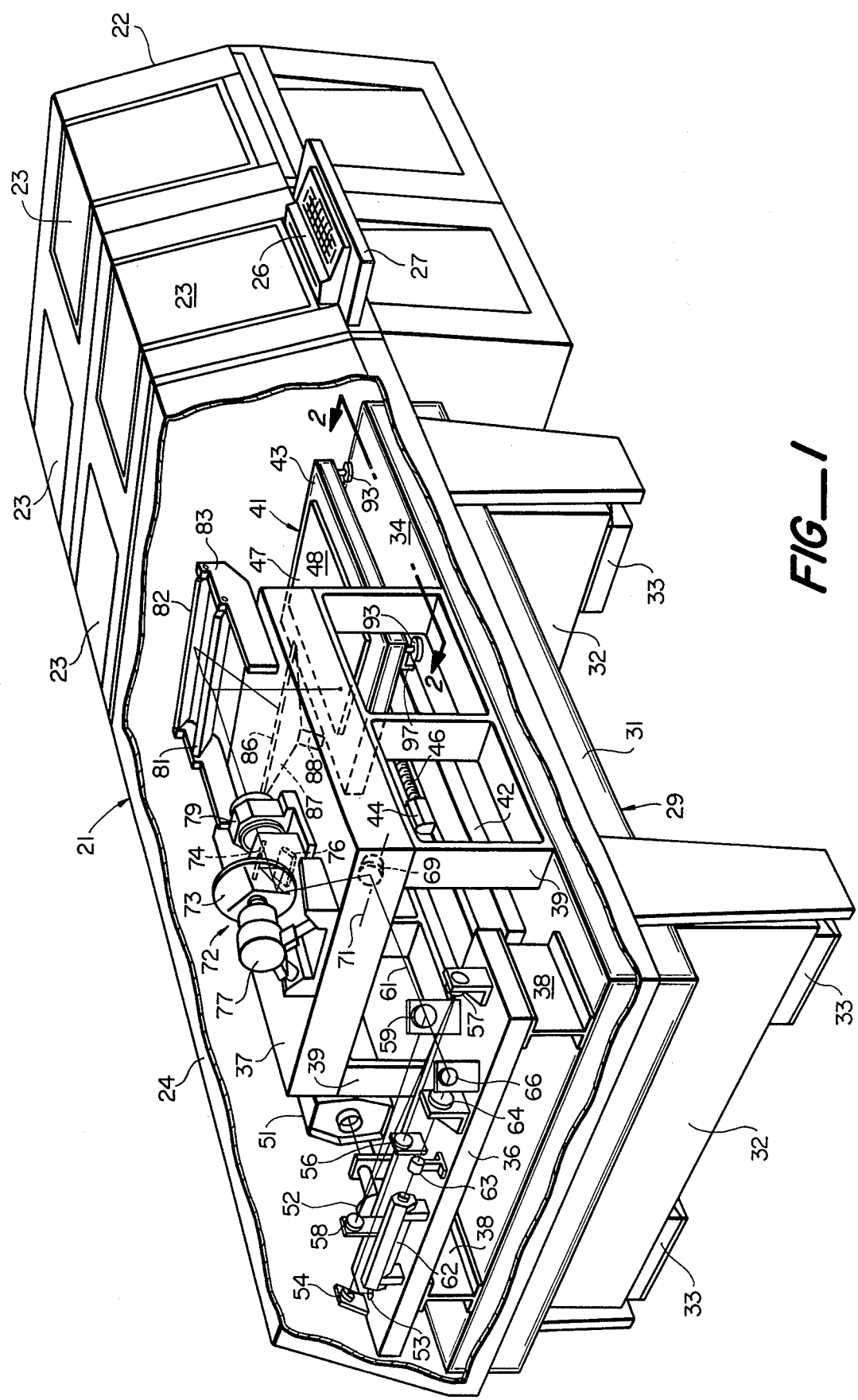
FIG_1

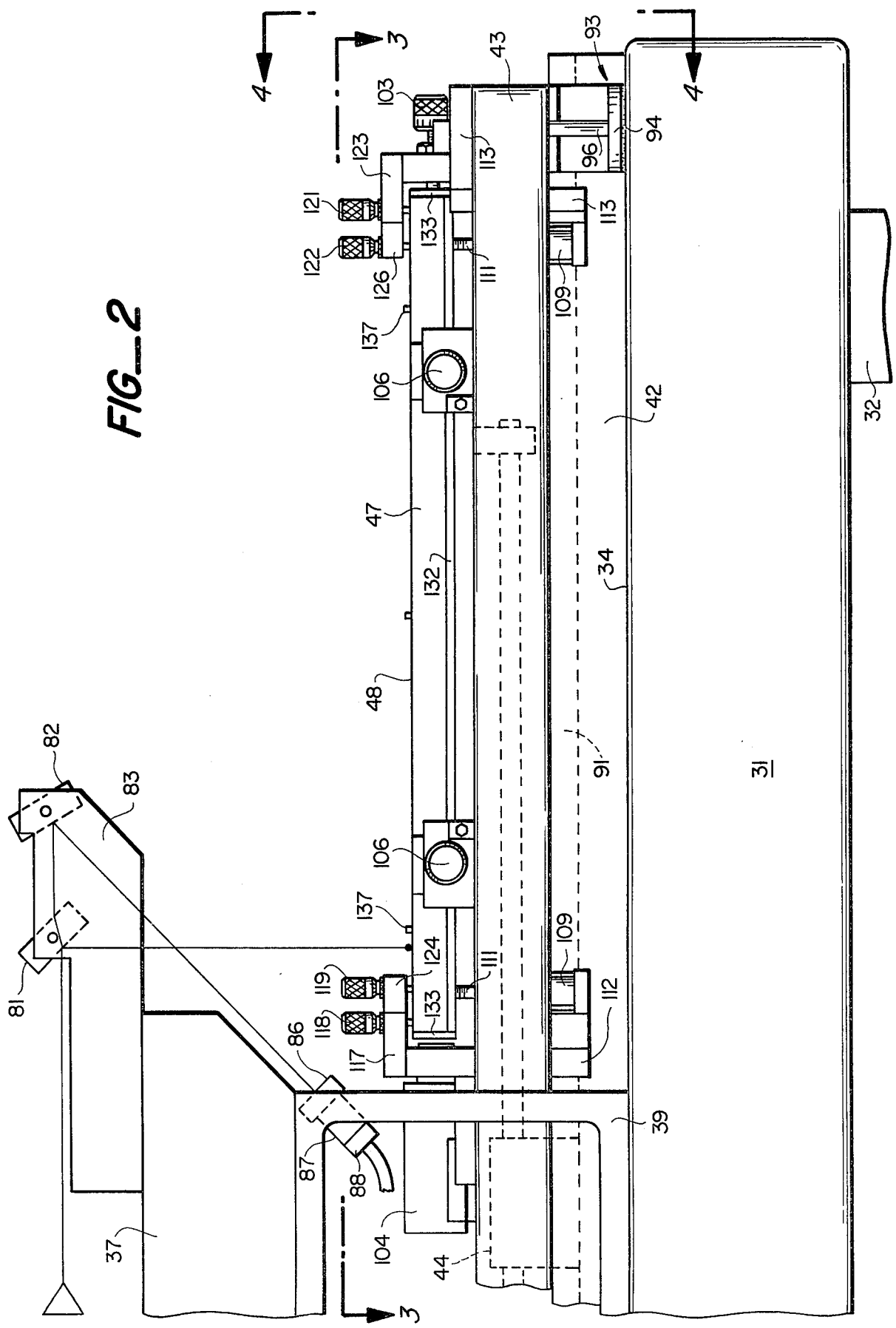

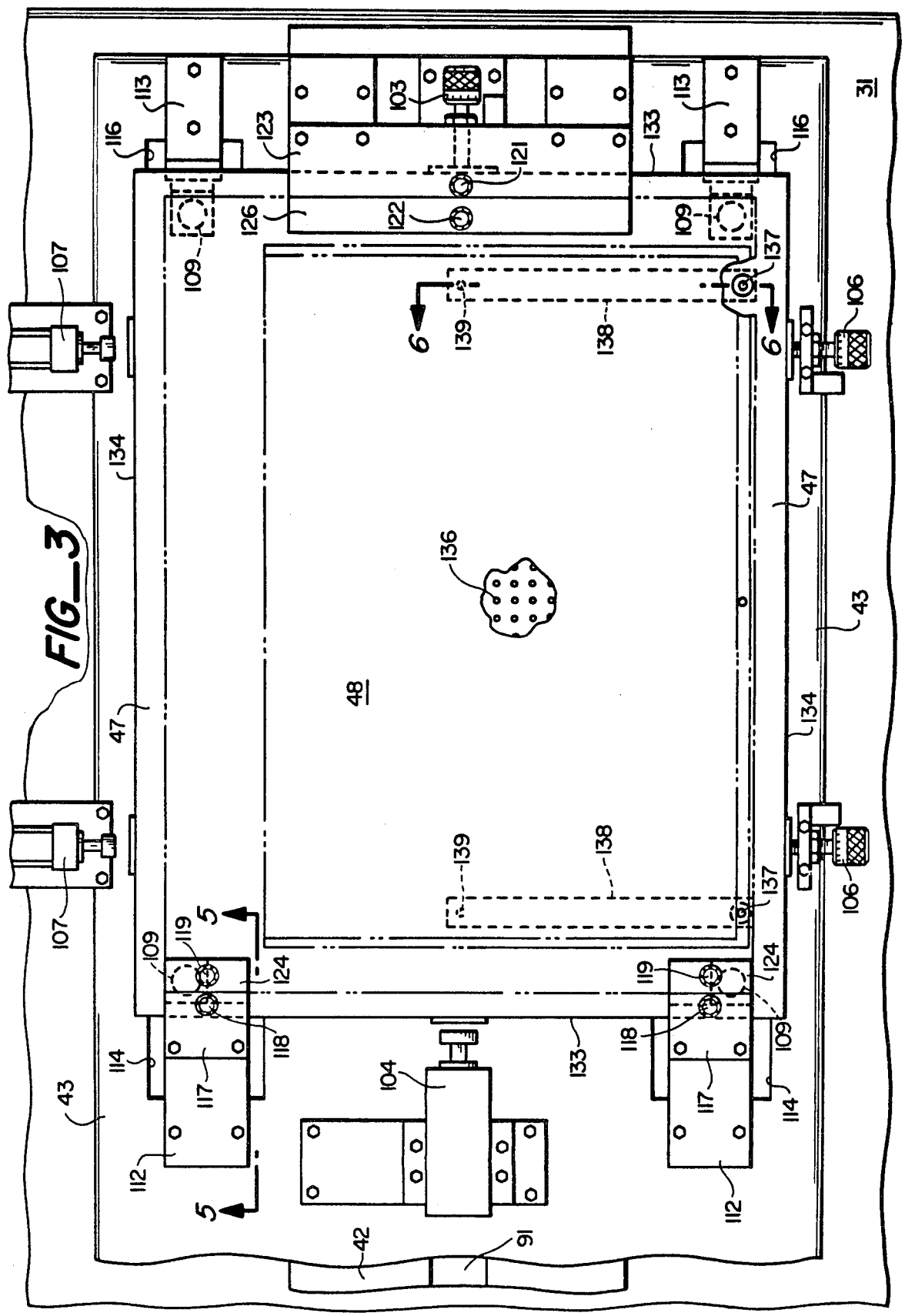

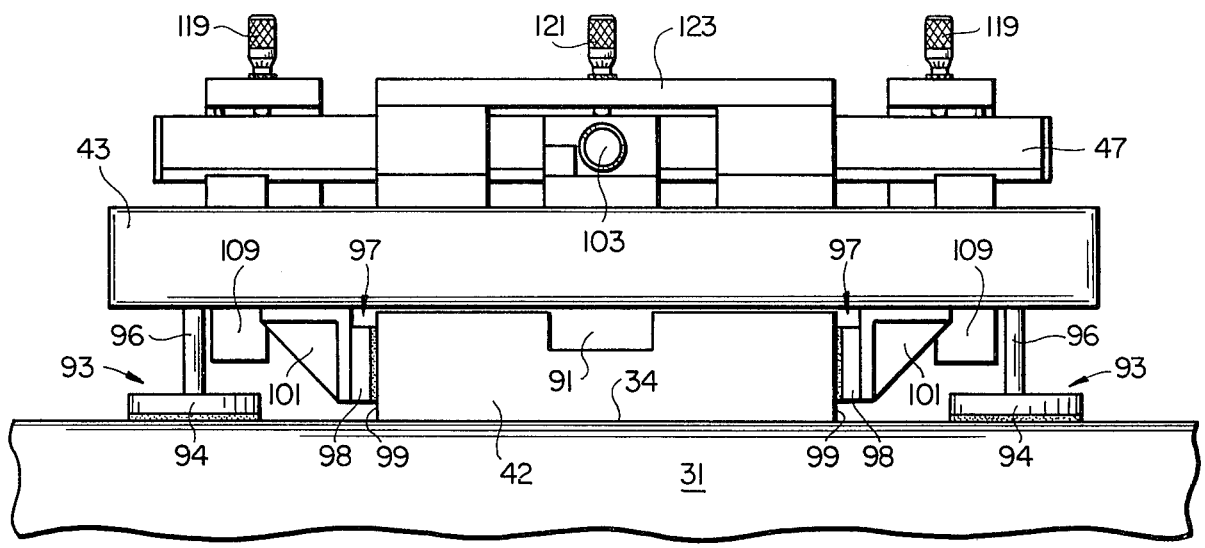
FIG_4
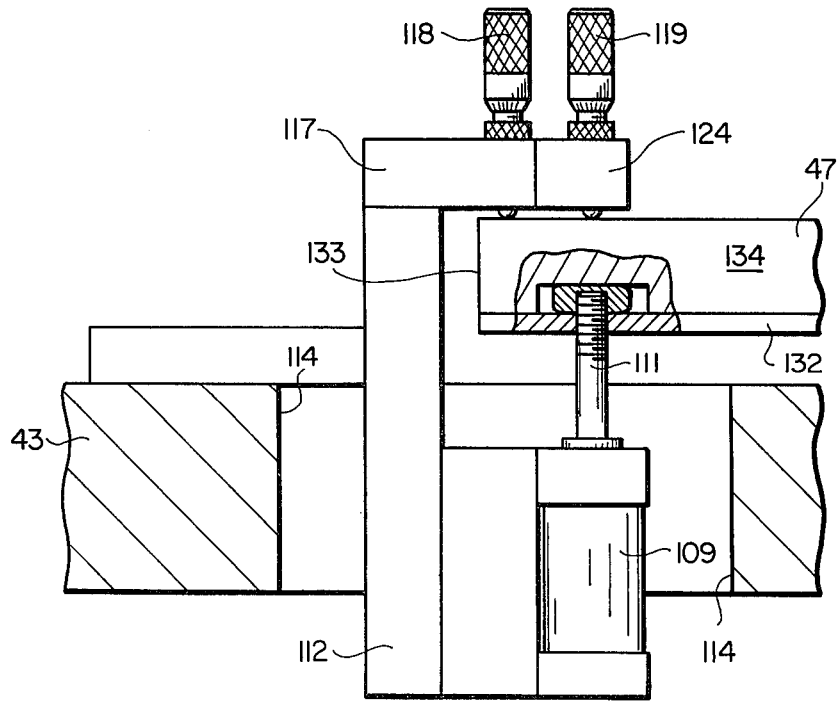
FIG_5
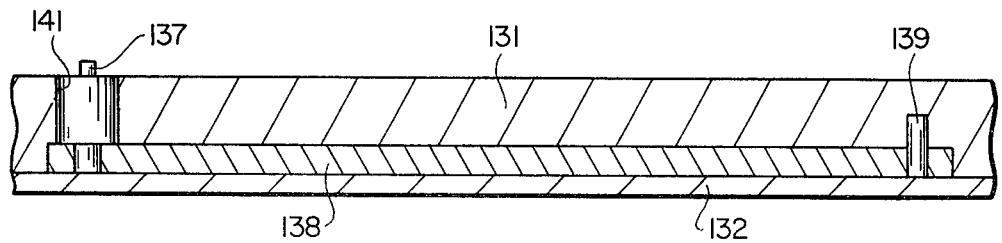
FIG_6

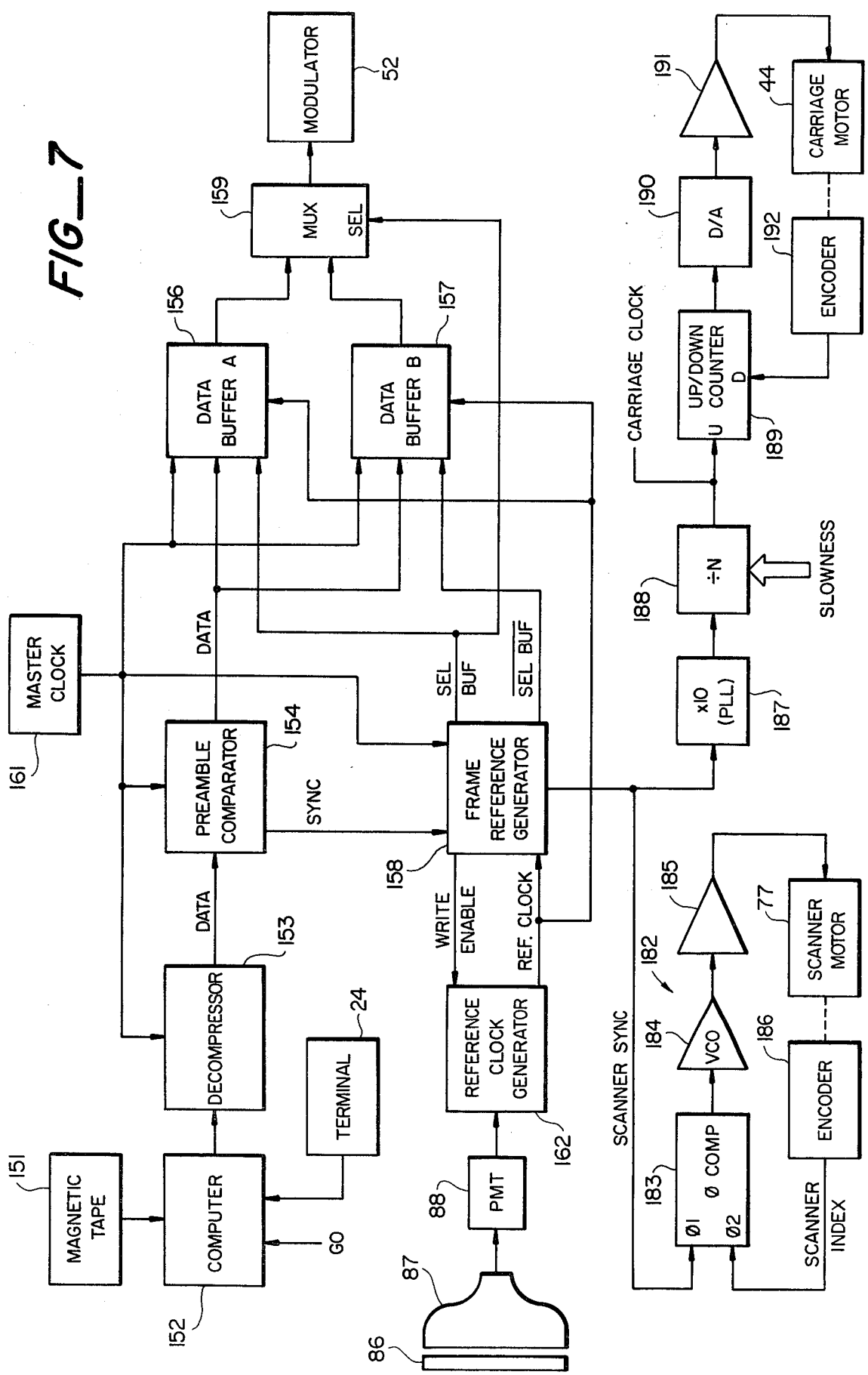
FIG_7

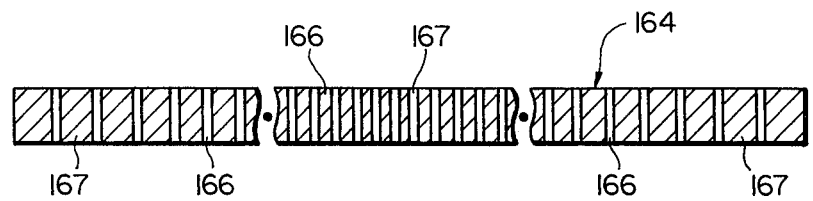
FIG_8
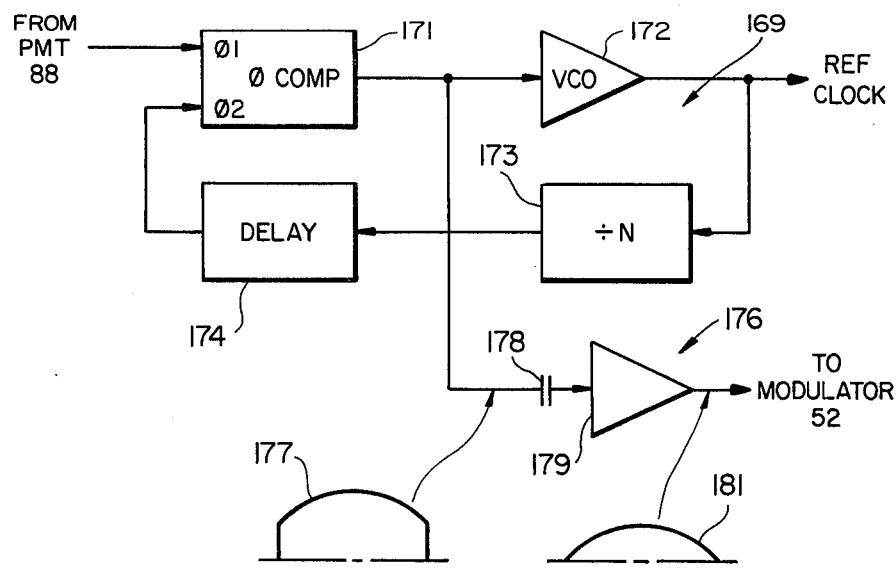
FIG_9
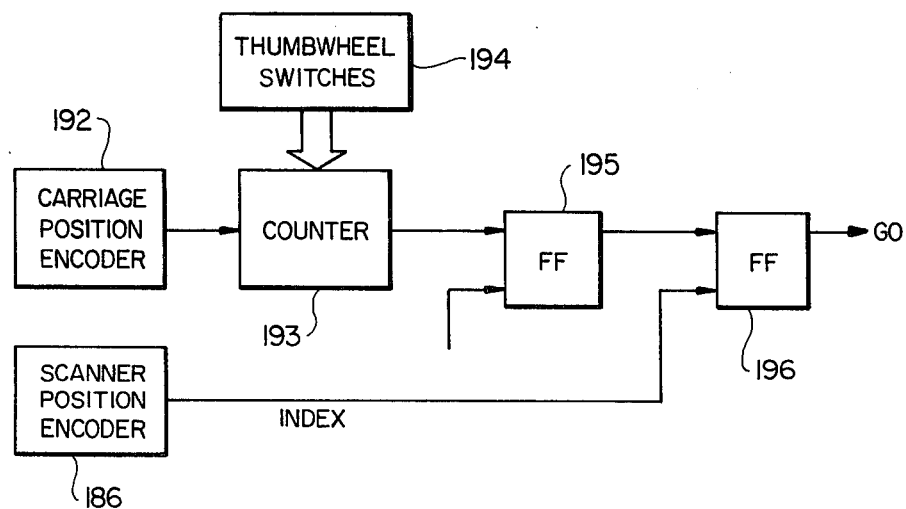
FIG_10

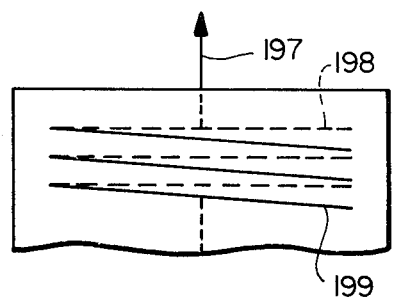
FIG_11
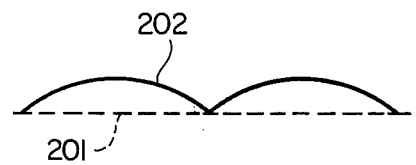
FIG_12
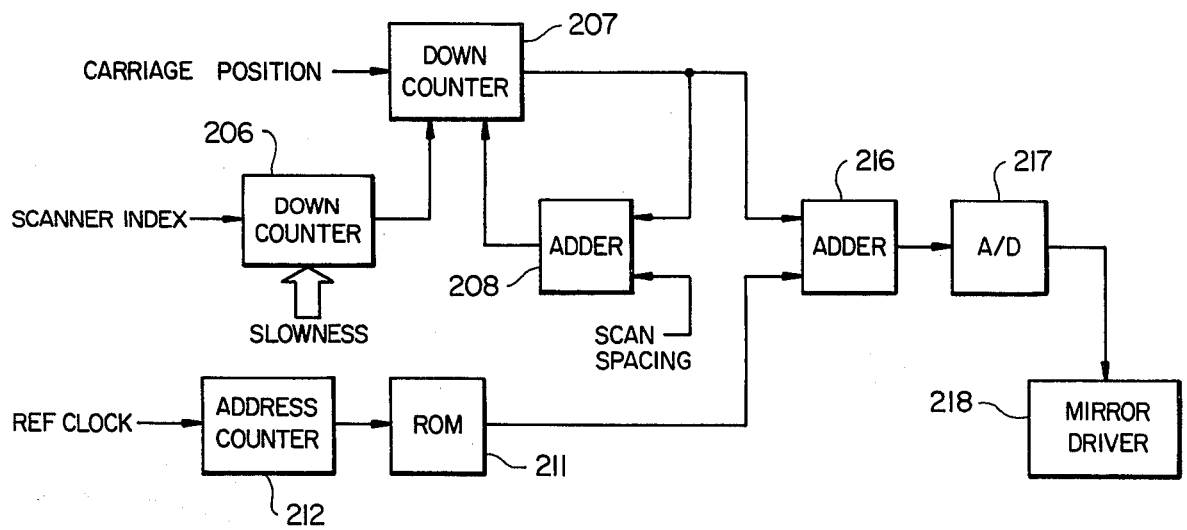
FIG_13
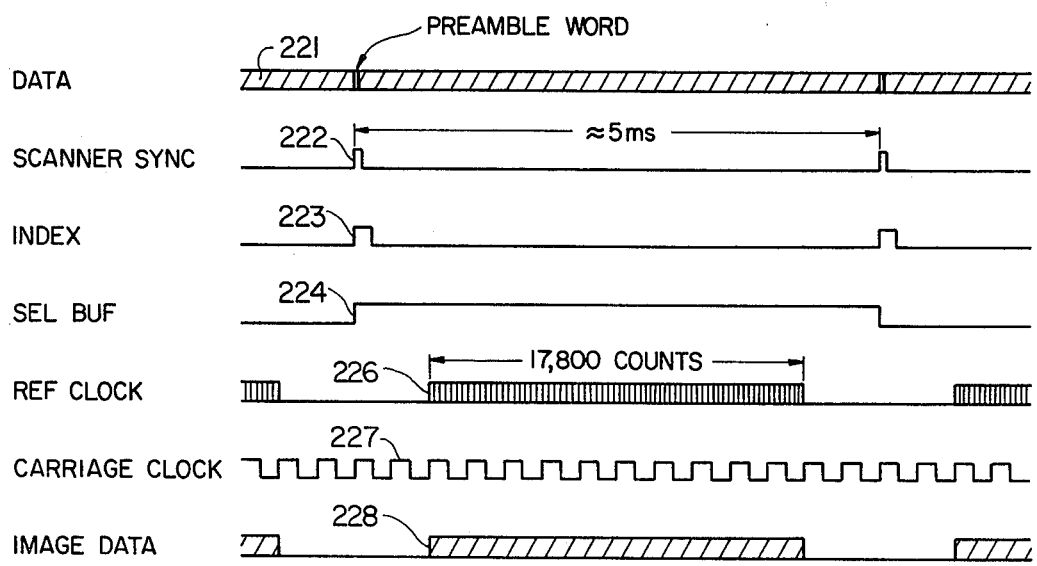
FIG_14

IMAGING SYSTEM AND METHOD FOR PRINTED CIRCUIT ARTWORK AND THE LIKE

This invention pertains generally to the manufacture of printed circuit boards and more particularly to a system and method for producing artwork for printed circuit boards.

In the manufacture of printed circuit boards, artwork masters are commonly employed in the formation of conductive lead patterns on the boards. The lead patterns can include a large number of relatively narrow leads spaced closely together. These leads must be sharply defined, and an artwork master having high resolution and accuracy is required. Heretofore, artwork masters have been prepared photographically, and laser systems of the prior art have generally not been capable of the high degree of accuracy required in the production of such artwork.

It is in general an object of the invention to provide a new and improved system and method utilizing a laser beam for producing artwork for printed circuit boards.

Another object of the invention is to provide a system and method of the above character which can produce more precise artwork than has been possible with laser techniques of the prior art.

Another object of the invention is to provide a system and method of the above character in which a precise relationship is maintained between the input data and the output image notwithstanding chromatic aberration and other image distortions in certain elements of the system.

These and other objects are achieved in accordance with the invention by providing a system and method wherein a laser beam is modulated in accordance with data defining the artwork to be produced. The modulated beam is directed toward an output medium and deflected to effect scanning of the medium to form an image of the artwork on the medium. A reference beam is deflected with the laser beam and directed toward a reference mask to provide a reference signal which defines the position of the laser beam and is employed to provide synchronization between the modulation of the laser beam and the position of the laser beam on the output medium. Compensation is provided to maintain a precise relationship between the input data and the output image notwithstanding non-linearities, chromatic aberration and other image distortions introduced by certain elements of the system.

FIG. 1 is an isometric view, partly broken away and somewhat schematic, of one embodiment of a system incorporating the invention for producing printed circuit artwork.

FIG. 2 is an enlarged fragmentary elevational view taken along line 2—2 in FIG. 1.

FIG. 3 is a fragmentary plan view taken along line 3—3 in FIG. 2.

FIG. 4 is a fragmentary side elevational view taken along line 4—4 in FIG. 2.

FIG. 5 is an enlarged fragmentary sectional view taken along line 5—5 of FIG. 3.

FIG. 6 is an enlarged fragmentary sectional view taken along line 6—6 in FIG. 3.

FIG. 7 is a functional block diagram of the system of FIG. 1.

FIG. 8 is a plan view, somewhat schematic, of the reticle of the reference mask in the system of FIG. 1.

FIG. 9 is a block diagram of the reference clock generator and image correction circuits of the system of FIG. 7.

FIG. 10 is a block diagram of a carriage and scanner synchronizing circuit for the system of FIG. 1.

FIGS. 11 and 12 illustrate certain image distortions which are corrected in the system of FIG. 1.

FIG. 13 is a block diagram of a circuit for compensating for non-linearities of the type illustrated in FIGS. 11 and 12.

FIG. 14 is a timing diagram for the system of FIG. 7.

As a general overview, data defining the artwork to be produced is stored on magnetic tape and read into the memory of a computer. An image of the artwork is formed on an output medium scanned in raster fashion by a laser beam modulated in accordance with the data from the computer. In the preferred embodiment, the output image has a size of 17.8"×24.2", with 1,000 scan lines per inch and 1,000 pixels per inch in each scan line. Thus, every 0.001 inch in either scan direction over the entire image area is addressable. Suitable output media include diazo film, silver halide film, and glass plates. With a suitable laser, it may also be possible to form the image directly on the printed circuit boards.

The entire system is enclosed in a cabinet 21 having a first section 22 which houses the computer, tape deck, power supply and other electronic components, with doors 23 providing access to these components. The cabinet also includes a second section 24 which encloses the laser, optical, scanning and carriage assemblies of the system, with suitable access doors (not shown). A keyboard terminal 26 provides communication with the computer and is mounted on a shelf 27 which projects from cabinet section 22 so that the terminal is accessible externally of the cabinet.

The laser, optical, scanning and carriage assemblies are supported by a massive table 29 to reduce vibration and thermally induced variations and permit the accuracy required for printed circuit artwork. In the preferred embodiment, the table is made of granite and includes a horizontally extending slab 31 having a thickness of approximately 8–10 inches supported by pedestals 32 and leveling blocks 33. The upper surface 34 of slab 31 is highly polished and has a flatness over its entire surface of 0.001 inch or better.

Smaller tables 36, 37 are mounted on the base table 34 supporting the optical and scanning components of the system. Table 36 is sometimes referred to as the optical table, and it comprises a horizontally extending slab of granite supported by steel frame members 38 in the form of I-beams. Table 37 is sometimes referred to as the scanning table, and it also comprises a horizontally extending slab of granite supported by steel side frames 39. Thus, tables 36, 37 are rigidly supported above the base table in stationary positions.

A carriage assembly 41 is mounted on the base table for holding the output medium on which the image of the artwork is to be formed. This assembly includes a guide rail 42 which is affixed to the upper surface of table 31, and extends longitudinally of that table and beneath scanning table 37. In the preferred embodiment, the guide rail is also fabricated of granite, and a carriage 43 is mounted on the rail for movement in the longitudinal direction. The carriage is driven by a motor 44 and a lead screw 46. A platen 47 having a highly accurate flat surface 48 is mounted on the carriage for holding the output medium.

A laser 51 for generating a writing beam of coherent radiation is mounted on table 31 to the rear of scanning table 37, as viewed in FIG. 1. In one presently preferred embodiment for exposing diazo and silver halide film, laser 51 comprises a Coherent, Inc. Model CR-15 argon laser. This laser maintains a relatively constant power output notwithstanding variations in the operating power supplied to the laser.

The output of laser 51 is directed to an acousto-optical modulator 52 of suitable known design for varying the intensity of the writing beam in accordance with input signals applied thereto. From the modulator, the writing beam passes to a turning mirror (not shown) mounted on the base table and is directed upwardly through an aperture 53 in optical table 36 to a second turning mirror 54 which is mounted on that table. From mirror 54 the beam is directed in a horizontal direction and passes through an ultraviolet attenuator/filter 56. The beam then passes to a spherical mirror 57 and then to a parabolic mirror 58 where it is focused to provide an ultimate spot size no greater than 0.001 inch. From mirror 58, the beam is directed to a dichroic beam combiner 59 where it is combined with a reference beam and directed along a common path 61 toward the scanning assembly.

A HeNe laser 62 is mounted on table 36 to generate the reference beam. The beam produced by laser 62 is directed horizontally through an objective lens 63 and a beam expander 64 to a turning mirror 66 which directs the beam to dichroic mirror 59 for combination with the writing beam.

The combined writing and reference beams from dichroic mirror 59 impinge upon a piezoelectric mirror 69 which is mounted on the underside of scanning table 37. A suitable mirror for this purpose is a Burleigh Inc. Model PZ-90 mirror assembly. This assembly comprises a mirror mounted on three piezoelectric stacks or tubes spaced 120° apart. By applying suitable control voltages to the piezoelectric stacks, the mirror can be tilted to any desired angle within its range. In the invention, the piezoelectric mirror is oriented with two of the stacks aligned with a horizontal axis 71 which is perpendicular to beam path 61 and to the direction of travel of carriage 43. These two stacks are maintained at a reference potential, and a control signal is applied to the third stack to control the angle of tilt about axis 71.

From piezoelectric mirror 69, the combined beam is directed to a scanner 72 of the type described in detail in copending application Ser. No. 941,763, filed Sept. 13, 1978, and assigned to the assignee herein. Briefly, this scanner comprises a pyramidal mirror 73 and a roof mirror doublet comprising flat mirrors 74, 76. The pyramidal mirror has three flat axially inclined reflective facets and is rotated about its axis at a relatively high speed by a drive motor 77. The scanner is mounted on table 37 in a stationary position on the upper side of that table. The beam from mirror 69 impinges upon one of the rotating facets and is reflected toward mirror 74. This mirror reflects the beam to mirror 76 which reflects it back to the same rotating facet from which it was reflected initially. The beam is then reflected out of the scanner to a flat field lens 79 which is mounted in a stationary position on the upper surface of the scanning table. The beam emerging from scanner 72 and lens 79 sweeps horizontally from side to side, with substantially no angular displacement in the vertical direction.

The beam from lens 79 impinges upon a dichroic beam splitter 81 which reflects the writing beam downwardly toward the carriage assembly and passes the reference beam to a mirror 82. Beam splitter 81 and mirror 82 are mounted in fixed positions by a frame 83 secured to table 37. The relative positions of the flat field lens, beam splitter and carriage assembly are such that the upper surface of an output medium carried by the carriage lies in the focal plane of the flat field lens.

From mirror 82, the reference beam is directed to a reference mask 86. As discussed more fully hereinafter, light passing through the reference mask is collected by a fiber optic bundle and sensed by a photodetector or photo multiplier tube 88 to provide a reference signal corresponding to the position of the writing beam on the output medium. The reference mask is supported in a stationary position on the underside of scanning table 37 in the focal plane of lens 79.

Referring now to FIGS. 2–6, the carriage assembly is illustrated in greater detail. Drive motor 44 is mounted in a longitudinally extending slot 91 of generally rectangular cross section in guide rail 42. Lead screw 46 is threadedly received in a nut 92 affixed to the carriage. The carriage is supported vertically by air bearings 93 which rest upon the highly polished surface of table 31 to permit substantially frictionless movement of the carriage. As illustrated, these bearings include circular pads 94 connected to the underside of the carriage by posts 96. A similar bearing 93 is provided at each corner of the carriage. Additional air bearings 97 are provided between the carriage and the guide rail. These bearings comprise generally rectangular pads 98 which face the longitudinally extending vertical side faces 99 of the guide rail. Pads 98 are secured to the lower side of the carriage by mounting brackets 101, and in the embodiment illustrated, bearings 97 are provided at both ends of the carriage.

Platen 47 is positioned longitudinally on carriage 43 by means of an adjustable stop 103 and a hydraulic cylinder 104. The platen is positioned laterally by adjustable stops 106 and hydraulic cylinders 107. The stops are mounted on the carriage and positioned to engage the end and side walls of the platen when the platen is in the desired position on the carriage. The cylinders are also mounted on the carriage and positioned opposite the stops for pressing the platen against the stops.

Means is also provided for adjusting the position of the platen vertically on the carriage. This means includes hydraulic operating cylinders 109 mounted on the carriage toward the corners of the platen. Each of the cylinders has an output shaft 111 which is threadedly received in the lower portion of the platen. The bodies of the operators are mounted on brackets 112, 113 which are affixed to the carriage. These mounting brackets extend through openings 114, 116 in the carriage, and brackets 114 include horizontal flanges 117 positioned above the platen at one end thereof. These flanges carry adjustable stops 118, 119 which engage the upper surface of the platen to position it vertically. At the other end of the platen, similar adjustable stops 121, 122 are mounted on a mounting bracket 123 which is affixed to the carriage. The stops are arranged in pairs, with stops 119, 122 being positioned inwardly of stops 118, 121. The inner stops are carried by detachable bars 124, 126, which are removably mounted on the inner edges of flanges 117 and bracket 123 by suitable means such as screws and positioning dowel pins (not shown). In the preferred embodiment, stops 118–119, 121–122 comprise micrometers which permit the platen to be accurately aligned to position the upper surface of the output medium in the focal plane of the flat field lens. The paired stops permit adjustments for media of different thicknesses, e.g., 0.007 inch film and 0.250 inch glass. The removable inner stops permit the system to accommodate media of different lengths.

Platen 47 is a generally hollow structure having a top wall 131, a bottom wall 132, end walls 133 and side walls 134. Pin holes 136 extend through the top wall, as illustrated in the enlarged area of FIG. 3, and the output medium is held flat against the top surface of the platen by a vacuum applied through these holes.

Means is provided for accurately positioning the output medium on the platen and maintaining this position notwithstanding changes in temperature. This means includes registration pins 137 carried by Invar bars 138 which are affixed to the upper wall of the platen by pins 139 at the centerline of the scanning system. The bars are located below the top wall of the platen, and the registration pins extend through openings 141 of slightly greater diameter than the pins themselves. The Invar bars have a substantially zero coefficient of thermal expansion at the normal operating temperatures of the system. Therefore, the positions of the registration pins remain accurately fixed relative to the vertical centerline of the scanning system even though the platen itself may undergo thermal expansion or contraction. Likewise, an output medium having openings engaged by the registration pins is held in a relatively fixed position.

Referring now to FIG. 7, data defining the artwork to be produced is stored on a magnetic tape. In the preferred embodiment, the data is generated by scanning input copy, but it can be generated by scanning input copy, but it can also be generated electronically if desired. In either case, the data is spatially coded in that it represents elements located at predetermined spatial positions in the image. Rather than storing a separate bit for each element of the image, the data is compressed and stored in a compressed format. From the tape, designated 151 in FIG. 7, the data is read into the memory of a computer 152 such as PDP-11. Terminal 26 is connected to the computer, and from the computer the data is delivered to a decompressor 153 which converts the compressed data to a serial format containing one bit for each element of the image.

In addition to the image data, the decompressed data includes a 16-bit preamble containing status control and synchronizing information at the beginning of each scan line. The system includes a preamble comparator 154 which receives the data from decompressor 153, checks the preamble and delivers the image data to buffers 156, 157. The preamble comparator also delivers a SYNC signal to a frame reference generator 158. This generator delivers SEL BUF and $\overline{\text{SEL BUF}}$ signals to buffers 156, 157 to control the buffers so that data can be read into one of them while it is being read out of the other. The outputs of the data buffers are connected to the inputs of a multiplexer 159, and the SEL BUF signal is applied to the SELECT input of the multiplexer to determine which buffer the data will be read out of. The output of multiplexer 159 is applied to the input of modulator 52 whereby the writing beam is modulated in accordance with the image data.

The delivery of data from the decompressor to the preamble comparator and to the data buffers is controlled by a free running master clock 161 operating at a suitable frequency such as 4.5 MHz. The data is clocked out of the data buffers and delivered to the modulator under the control of a reference clock signal which corresponds to the position of the writing beam on the output medium. The reference clock signal is generated by a reference clock generator 162 which receives the reference signal from photomultiplier tube 88. The reference signal is produced by light from the reference beam passing through the reference mask and being detected by the photomultiplier tube. Since the reference beam and the writing beam are directed along a common path and deflected together by the scanner, the reference signal is closely synchronized in position with the writing beam. Each pulse of the reference signal corresponds to the predetermined distance (e.g., 0.003 inch) on the output medium. The reference clock generator increases the rate of the reference signal to provide a reference clock pulse for each 0.001 inch of writing beam travel.

As illustrated in FIG. 8, reference mask 86 comprises a reticle 164 having a plurality of opaque areas 166 and transmissive areas 167 alternately arrayed along the length of the mask. The opaque areas consist of opaque bars which are spaced apart on a transparent medium to form the transmissive areas. The lens 79 and the dichroic beam splitter 81 have been found to have chromatic aberrations which cause the reference beam to be deflected somewhat farther than the writing beam toward the ends of the scan line. The magnitude of the error is on the order of 0.001 inch at the ends of the scan. To compensate for this error, the transmissive areas are arranged in a non-linear fashion on the reticle. These areas are of a uniform width throughout the array, but the spacing between them increases toward the ends of the array. In other words, the opaque bars are wider toward the sides of the reticle than in the center, as illustrated in somewhat exaggerated fashion in FIG. 8. This correction assures a precise relationship between the reference clock signal and the position of the writing beam notwithstanding the chromatic aberrations of the lens and the beam splitter.

It has also been found that transmission delays in both the electrical circuitry and the optical elements can result in a positional error in the formation of the image on the output medium. This error arises becauses the reference clock signal is generated when the writing beam is in the position where a given data bit is to be imaged. By the time the reference clock signal reaches the data buffers and multiplexer, the data reaches the modulator, and the modulated beam reaches the output medium, the beam will have moved from the position where it was when the clock pulse was generated. The effect of this error is compounded by non-linearities in the velocity of the beams across the scan line. As discussed more fully hereinafter, the beam velocity increases toward the center of each scan and decreases toward the ends. Thus, the relatively constant transmission delay causes a greater positional error in the image toward the center of the scan than toward the ends. The error is avoided by generating the reference clock pulse in such manner that it appears to occur prior to the time the beam reaches the point where the data bit is to be imaged. The output media is shifted to compensate for the error at the minimum beam velocity, and a previously generated clock pulse is shifted forward in phase to compensate for the variations in velocity. Means for effecting this phase shift is included in the reference clock generator.

As illustrated in FIG. 9, the reference clock generator includes a phase locked loop comprising a phase detector 171, a voltage controlled oscillator 172, a divide-by-N counter 173, and a delay network 174. The reference signal from photomultiplier tube 88 is applied to one input of the phase comparator, and the output of the phase comparator is connected to the input of the voltage controlled oscillator.

The output of the oscillator is connected to the input of counter 173, and the output of the counter is connected to the input of the delay circuit. The output of the delay circuit is connected to the second input of the phase comparator. The reference clock signal appears at the output of the voltage controlled oscillator. The capacity of counter 173 is chosen in accordance with the multiplication to be provided by the circuit, and the reference clock rate is N times the rate of the input signal from the photomultiplier tube. The amount of forward phase shift is determined by the amount of delay in the loop, and in one presently preferred embodiment, a delay on the order of 0.5–0.7 microsecond provides a phase shift on the order of 14 radians at a frequency of 4.5 MHz. With this phase shift, the reference clock signal appears to occur before it actually does, and notwithstanding the electrical and optical delays in the system, each data bit is imaged at the proper position.

Means is also provided for adjusting the intensity of the writing beam to maintain a uniform exposure of the output medium across the scan line notwithstanding variations in the horizontal velocity of the beam. With scanning mirror 73 rotating at a relatively constant angular velocity, the horizontal velocity of the writing beam tends to decrease toward the ends of the scan. To compensate for the increased exposure which would otherwise result, means is provided for reducing the intensity of the beam toward the ends of the scan. This means includes an intensity correction circuit 176 connected to the phase locked loop 169 of the reference clock generator at a point where a signal proportional to the horizontal velocity of the beam is present. Such a signal is found at the output of phase comparator 171 and is illustrated by waveform 177 in FIG. 9. The intensity correction circuit includes an input capacitor 178 and an amplifier 179. The signal at the output of this amplifier is a voltage which decreases toward the sides of the scan, and this voltage is applied to modulator 52 to vary the intensity of the writing beam and maintain a uniform exposure throughout the scan.

Referring again to FIG. 7, frame reference generator 158 provides a SCANNER SYNC signal which is utilized for synchronizing scanner motor 77. The scanner motor is connected in a phase locked loop 182 with a phase comparator 183, a voltage controlled oscillator 184, an amplifier 185, and an encoder 186. The SCANNER SYNC signal is applied to one input of the phase comparator, and the output of the phase comparator is connected to the input of the voltage controlled oscillator. The output of the oscillator is connected to the input of the amplifier which provides the driving signal for the scanner motor. Encoder 186 is a shaft position encoder which delivers an INDEX signal when mirror 73 is in position to begin a new scan. The INDEX signal is applied to a second input of the phase comparator.

The SCANNER SYNC signal is also applied to the input of a phase locked loop 187, which delivers a signal at a suitable multiple (e.g., 10) of the SCANNER SYNC pulse rate, and the output of this circuit is connected to the clock input of a presettable counter 188. The output of this counter is a CARRIAGE CLOCK signal which is synchronized with the SCANNER SYNC signal and utilized to control the movement of the carriage, the carriage speed being proportional to the frequency of the CARRIAGE CLOCK signal.

As noted above, the system can be utilized with a variety of different output media, and the different output media generally require different exposure times to form a given image. For example, whereas a silver halide film might require only 2 minutes for an image, a diazo film might require 80 minutes for the same image. In order to provide the desired range of exposure, the carriage speed is variable and the scan lines are repeated. The carriage speed is controlled by a SLOWNESS signal which is applied to the present inputs of counter 188. This signal causes the CARRIAGE CLOCK signal to be reduced by a slowness factor N, and each scan is repeated N times. Thus, for a slowness factor of 1, the carriage moves at its maximum speed, and each line is scanned once. For a slowness factor of 10, the carriage speed is reduced to one-tenth of the maximum speed, and the scan is repeated so that each line is scanned 10 times with the same data.

Carriage motor 44 is driven in synchronism with the CARRIAGE CLOCK signal by means of a loop comprising an UP/DOWN counter 189, a digital-to-analog converter 190, an amplifier 191, and an encoder 192. The CARRIAGE CLOCK signal is applied to the UP counting input of the counter, and the output of this counter is connected to the input of the digital-to-analog converter. The analog output signal is amplified to provide the driving signal for the carriage motor. Encoder 192 comprises a reticle having a linear scale for providing a signal corresponding to the position of the carriage. This signal is applied to the DOWN counting input of counter 189.

As illustrated in FIG. 10, means is also provided for synchronizing the delivery of data with the carriage and scanner positions at the start of an image. The signal from carriage position encoder 192 is applied to the input of a presettable counter 193, and a count corresponding to the position at which the image is to begin is applied to the present inputs of this counter by thumb wheel switches 194. The output of counter 193 is connected to the input of a flip-flop 195 and the output of this flip-flop is connected to one input of a second flip-flop 196. The INDEX signal from scanner position encoder 186 is applied to a second input of flip-flop 196. In operation, counter 193 counts the pulses from the carriage position encoder until the carriage reaches the position set by switches 194. When this count is reached, flip-flops 195, 196 are set, and the next INDEX signal from scanner position encoder 186 which causes flip-flop 196 to deliver a GO signal to computer 152 to initiate the delivery of data.

The system also provides the compensation for several other potential distortions which might otherwise degrade the quality of the output image. These distortions include tilting of the scan lines due to the continuous travel of the carriage, blurring of the image when the scan lines are repeated on a moving media, improper vertical positioning of the scan lines due to irregular movement of the carriage, and a slight curvature of the scan lines which is introduced by scanner 72.

FIG. 11 illustrates the tilting of the scan lines which occurs when the carriage is driven continuously during the scanning process. It is assumed that the carriage is driven in the upward direction, as indicated by arrow 197, and that the scanning progresses from left to right, as viewed in this Figure. If the carriage were stationary, the scan lines would extend straight across the output medium in a direction perpendicular to the carriage travel, as indicated by dotted lines 198. However, when the carriage moves during the scanning process, the scan lines are tilted or inclined, as illustrated by lines 199. The amount of tilt is a function of the relative speeds of the carriage and scanner, and for a line spacing of 0.001 inch, a point located toward the right side of a scan line is nearly 0.001 inch below where it should be.

FIG. 12 illustrates the slight curvature which is introduced into the scan line by scanner 72. In this figure, the desired straight trace is represented by dashed line 201, and the slightly curved trace produced by the scanner is illustrated in exaggerated form by line 202. The actual trace lies on the desired path at the ends and center of the scan line, but is displaced along a curved path between the center and each end. For a scan line having a length of 17.8", the maximum displacement is on the order of 0.004–0.006 inch.

Means for compensating for these four distortions is illustrated in FIG. 13. This means includes a presettable down-counting counter 206 having the scanner INDEX signal applied to its clock input and the SLOWNESS signal applied to its preset inputs. Thus, this counter functions as a divide-by-N counter which divides the scanner INDEX signal by the slowness factor. The overflow output of counter 206 is connected to the load input of a second presettable down-counting counter 207. The carriage position signal is applied to the clock input of counter 207, and the weighted output of this counter is connected to one input of an adder 208. A constant SCAN SPACING signal corresponding to the desired spacing between the scan lines is applied to a second input of the adder, and the output of the adder is connected to the preset input of counter 207. For normal carriage movement (SLOWNESS−1), the count in adder 208 is loaded into counter 207 at the start of each scan line. As the carriage travels, the pulses generated by the carriage position encoder reduce the count in counter 207 and adder 208 until the end of the scan line is reached. At the start of the next scan line, the count remaining in the adder is transferred to counter 207, thus raising the output of the counter by an amount corresponding to one scan line spacing. Thus, as each scan progresses, the level of the signal at the output of counter 207 decreases, and a control signal derived from this signal is applied to piezoelectric mirror 69 to deflect the writing beam to compensate for the tilt.

If the carriage is not in its proper position, the carriage position pulses will be displaced accordingly, and the scan line will be shifted by a corresponding amount to compensate for the carriage position error.

When the carriage is traveling at a slower speed (e.g., SLOWNESS=10), the count from adder 208 is not transferred to counter 207 at the start of each scan line. The transfer occurs at the rate determined by the SLOWNESS signal, e.g., every 10 scan lines for a slowness factor of 10. The output of counter 208 continues to decrease, causing the image forming beam to scan along the same track or line of the output medium for 10 successive scan lines. Thus, slowness blur distortion is eliminated at the same time that correction is provided for tilt and carriage position errors.

To compensate for the curvature introduced into the scan line by scanner 72, the amount of compensation required at each point in the scan is determined, and data defining the necessary correction voltages is stored in a read only memory 211. Address signals for the ROM are provided an address counter 212 which is clocked by the reference clock signal. Thus, as the scan progresses across the line, the correction signal data is read out of the ROM and utilized to provide a correction signal for piezoelectric mirror 69.

The outputs of counter 207 and ROM 211 are connected to the inputs of another adder 216 which combines the tracking and curved scan correction signals to provide a single signal which is converted to an analog signal by a digital-to-analog converter 217. The analog signal is applied to the piezoelectric mirror via a mirror driver 218. The mirror is thereby tilted to deflect the beam in such manner that it is displaced vertically (i.e., in the direction of carriage travel) to maintain a straight, evenly spaced, unblurred scan line perpendicular to the axis of carriage travel.

Operation and use of the system, and therein the method of the invention, can be summarized as follows. The output medium on which the image of the artwork is to be formed is placed on platen 47, and the carriage is returned to its starting position, as illustrated in FIG. 1. Carriage drive motor 44 is then energized, and when the carriage reaches the position at which the image is to begin, the delivery of data from the tape and computer begins. The writing beam from laser 51 is modulated in accordance with the data from the tape, and the beam is scanned across the output medium to form the desired image. The reference beam from laser 62 is deflected simultaneously with the writing beam and directed to reference mask 86 to provide the reference clock signal which controls the delivery of data to the modulator. As discussed above, compensation is provided for chromatic aberration and other distortions which might otherwise prevent the generation of an image having sufficient accuracy for printed circuit artwork.

The electronic control and data output sequencing is illustrated in the timing diagram of FIG. 14. In this figure, the decompressed data is represented by waveform 221. The SCANNER SYNC pulse (waveform 222) is generated in response to the preamble word at the start of each line of the data. When the system is properly synchronized, the scanner INDEX pulse (waveform 223) coincides with the SCANNER SYNC pulse, and the SEL BUF signal (waveform 224) is synchronized with these two pulses. The SEL BUF signal determines which buffer the data is read into and out of, and the reference clock signal (waveform 226) controls the delivery of data to the modulator from the selected buffer. The CARRIAGE CLOCK signal (waveform 227) is synchronized with the SCANNER SYNC signal and is a multiple thereof, e.g. 10 CARRIAGE CLOCK pulses for each SCANNER SYNC pulse. The image data delivered to the modulator in response to the reference clock signal is represented by waveform 228.

The invention has a number of important features and advantages. The optical components are extremely stable and free of vibration because of the massive structure of base table and other supporting structure. A variety of output media is readily accommodated, and the artwork produced by the system is of a uniform high quality throughout the entire image area. The system is capable of producing line widths and clearances as small as 0.002 inch at any point in the image area and at any pattern density. Features and clearances in the output image area are within 0.001 inch of the size defined by the input data. For a line parallel or perpendicular to the scan direction, the edge irregularity or resolution is less than ±0.0005 inch, as determined by measuring the lateral displacement between the innermost and outermost points on the line.

It is apparent from the foregoing that a new and improved system and method for producing artwork for printed circuit boards have been provided. While only certain presently preferred embodiments have been described herein, as will be apparent to those familiar with the art, certain changes and modifications can be made without departing from the scope of the invention as defined by the following claims.

What is claimed is:

1. In a system for use in the manufacture of printed circuit boards: a source of data representative of artwork to be formed on the circuit boards, laser means for providing a beam of coherent radiation, means for modulating the beam in accordance with the data, means for holding an output medium in position to be scanned by the beam, means for effecting scanning of the output medium by the modulated beam to form an image of the artwork on the output beam, means for sensing the position of the beam and providing a reference signal corresponding to the position of the beam on the output medium, means responsive to the reference signal for synchronizing the modulation of the beam with the position of the beam on the output medium, and means for shifting the phase of the reference signal forward in time to compensate for any delay between the generation of the reference signal and the arrival of the modulated beam on the output medium.

2. In a method utilizing a laser beam to produce artwork for printed circuit boards, the steps of: providing data signals defining the artwork to be produced, modulating the laser beam in accordance with the data signals, scanning the modulated laser beam across an output medium to form an image of the artwork on the output medium, monitoring the position of the beam and providing a reference signal corresponding to the position of the beam on the output medium, synchronizing the modulation of the beam in accordance with the reference signal, and shifting the phase of the reference signal forward in time to compensate for any delay between the generation of the reference signal and the arrival of the modulated beam on the output medium.

3. In a system for producing an image on an output medium: a source of data defining the image, means for providing a writing beam of coherent radiation, means for modulating the writing beam in accordance with data signals appled thereto, means for providing a reference beam, a reference mask having alternately arrayed transparent and opaque areas, means for simultaneously scanning the writing beam across the output medium and the reference beam across the reference mask, means responsive to reference beam energy transmitted by the reference mask for providing a reference signal corresponding to the position of the writing beam on the output medium, means responsive to the reference signal for controlling the delivery of data from the data source to the modulating means to provide synchronization between the modulation of the writing beam and the position of said beam in the output medium, and means for shifting the phase of the reference signal forward in time to compensate for signal transmission delays in the system so that the data is delivered when the writing beam is exactly in the position indicated by the reference signal.

4. In a system for producing an image on an output medium: a source of data defining the image, means for providing a writing beam of coherent radiation, means for modulating the writing beam in accordance with data signals applied thereto, means for providing a reference beam, a reference mask having alternately arrayed transparent and opaque areas, means for simultaneously scanning the writing beam across the output medium and the reference beam across the reference mask, means responsive to reference beam energy transmitted by the reference mask for providing a reference signal corresponding to the position of the writing beam on the output medium, means responsive to the reference signal for controlling the delivery of data from the data source to the modulating means to provide synchronization between the modulation of the writing beam and the position of said beam in the output medium, and means for shifting the phase of the reference signal to compensate for delays in the system so that the data is delivered when the writing beam is exactly in the position indicated by the reference signal, said means for shifting the phase of the reference signal including a phase locked loop incorporating a delay therein to effect a forward shift in the reference signal phase such that that signal appears to occur prior to the arrival of the beam at the point where the signal is generated.

* * * * *